(12) United States Patent
Giorgi et al.

(10) Patent No.: US 7,545,839 B2
(45) Date of Patent: Jun. 9, 2009

(54) APPARATUS AND METHOD FOR DRIVING A PULSED LASER DIODE

(75) Inventors: David M. Giorgi, Solana Beach, CA (US); Jay Philippbar, San Clemente, CA (US); James Long, Rancho Santa Fe, CA (US)

(73) Assignee: Optiswitch Technology Corporation, Can Diego, CA (US)

( * ) Notice: Subject to any disclaimer, the term of this patent is extended or adjusted under 35 U.S.C. 154(b) by 200 days.

(21) Appl. No.: 10/751,301

(22) Filed: Jan. 2, 2004

(65) Prior Publication Data

US 2004/0160996 A1    Aug. 19, 2004

Related U.S. Application Data

(60) Provisional application No. 60/439,069, filed on Jan. 8, 2003, provisional application No. 60/438,269, filed on Jan. 2, 2003.

(51) Int. Cl.
 *H01S 3/00* (2006.01)
(52) U.S. Cl. .............................. 372/38.02; 372/29.015; 372/38.07; 372/82
(58) Field of Classification Search .............. 372/38.07, 372/29.01–29.016, 38.02, 82, 38.1–38.09
See application file for complete search history.

(56) References Cited

U.S. PATENT DOCUMENTS

| | | | | |
|---|---|---|---|---|
| 3,371,232 A | * | 2/1968 | Hannan et al. ............ 372/38.03 |
| 3,577,017 A | * | 5/1971 | Duke et al. .................. 327/304 |
| 4,400,812 A | * | 8/1983 | Clark et al. ............... 372/38.02 |
| 4,928,248 A | * | 5/1990 | Takahashi et al. ......... 372/38.02 |
| 5,068,862 A | | 11/1991 | Zimmermann et al. |
| 5,089,727 A | * | 2/1992 | Molitor et al. .............. 327/181 |
| 5,394,415 A | * | 2/1995 | Zucker et al. .................. 372/26 |
| 5,406,572 A | | 4/1995 | Chung |
| 5,418,807 A | | 5/1995 | Chung |
| 5,444,729 A | | 8/1995 | Chung |
| 5,708,676 A | * | 1/1998 | Minamitani et al. ........... 372/86 |
| 2003/0016711 A1 | | 1/2003 | Crawford |
| 2003/0039280 A1 | | 2/2003 | Mangano et al. |

* cited by examiner

*Primary Examiner*—Minsun Harvey
*Assistant Examiner*—Tod T Van Roy
(74) *Attorney, Agent, or Firm*—Cyr & Associates, P.A.

(57) ABSTRACT

To achieve both a fast risetime and a desired flat top current pulse, or to be able to independently specify a risetime and pulse width (energy), a supplemental or "fast" voltage discharge stage (or multiple supplemental or "fast" voltage discharge stages) having a faster and shorter voltage discharge characteristic and a higher starting voltage relative to the main or "slow" voltage discharge stage is used in parallel with the slow voltage discharge stage. The energy storage element of the slow voltage discharge stage has sufficient energy storage at an appropriate voltage level for maintaining the desired flat top current throughout the pulse duration, while the energy storage element of the fast voltage discharge stage has less energy storage capability but a higher starting voltage for achieving the desired fast current pulse risetime. Preferably, a single closing switch is used to couple all energy storage elements to the laser diode to pulse it, although respective separate switches may be used to couple the energy storage elements of the various voltage discharge stages to the laser diode.

18 Claims, 10 Drawing Sheets

APPARATUS AND METHOD FOR DRIVING A PULSED LASER DIODE

CROSS-REFERENCE TO RELATED APPLICATIONS

This application claims the benefit of U.S. Provisional Patent Application No. 60/438,269, filed Jan. 2, 2003 (Giorgi et al., "Low impedance, fast rise time pulse generator system"), and of U.S. Provisional Patent Application No. 60/439,069, filed Jan. 8, 2003 (Giorgi et al., "Low impedance, fast rise time pulse generator system"), which are hereby incorporated herein by reference in their entirety.

INVENTORS

David Michael Giorgi, a citizen of the United States resident in Solana Beach, Calif. Jay Philippbar, a citizen of the United States resident in San Clemente, Calif. James Long, a citizen of the United States resident in Ranch Santa Fe, Calif.

BACKGROUND OF THE INVENTION

1. Field of the Invention

The present invention relates to pulsed laser diodes, and more particularly to current drivers for laser diodes having fast current pulse risetime.

2. Description of the Related Art

A laser diode operated in a pulsed mode should be driven by a current driver capable of achieving a fast current pulse risetime with good efficiency and small size. However, semiconductor laser diodes, particularly high power laser diodes formed from an array of interconnected individual laser diode devices, typically have an extremely low on-state resistance which complicates the design of a good pulsed laser driver.

To achieve a particular current waveform into a complex load impedance typically involves one of two fundamental approaches. A current source, such as a high resistive source or a large inductive source, can be used with an opening switch. This approach suffers from two disadvantages, the power dissipation during the interpulse time and the requirement for an opening switch with characteristics of high current, high voltage, fast switch time and low dissipation. The other approach is a voltage source.

FIG. 1 is a schematic circuit diagram of a conventional pulsed laser driver circuit 100 of the voltage source type, in which a capacitor 114 is used as the energy storage element. While the voltage source type circuit 100 has the advantages of simplicity and small size, it has the disadvantage of a long L/R time constant which compromises its ability to produce as fast a current pulse risetime as might be desired. The pulsed laser driver circuit 100 is operated at a voltage $V_{SUPPLY}$ applied at terminal 110, and includes a charging resistor 112, the capacitor 114, a closing switch 132, a laser diode load 142, and a ground 150. The switch 132 typically is a device such as a MOSFET or thyristor. The circuit also includes various inductances and equivalent series resistances ("ESR") associated with its components and physical layout, which are encircled in phantom lines in FIG. 1 to indicate that they are not intended components of the pulse driver circuit 100. Resistance 118 associated with the capacitor is the principal unintended resistance in the circuit 100. The principal undesirable inductances in the circuit 100 are a load inductance 140, a parasitic inductance 116 of the capacitor 114, a parasitic inductance 130 of the switch 132, and stray inductances 120 generally associated with the circuit assembly. These inductances establish the finite circuit inductance, which is responsible for the long L/R time constant in view of the extremely low resistance load imposed by the laser diode.

The problem with a long L/R time constant, in somewhat simplified terms, is the following. The magnitude of a flat top current pulse may be determined by the source voltage divided by the total circuit resistance. To achieve a given magnitude of flat top current in a low resistance load, a sufficiently large valued capacitance is used and the magnitude of the source voltage is fixed. However, the L/R time constant of the circuit limits the current risetime, regardless of the source voltage. Consider, for example, a need to supply a 1 kA flat top current pulse into a 5 mΩ load, which requires a supply voltage of 5 volts. A pulsed laser diode driver such as the circuit 100 typically has a total circuit inductance of about 10 nH, so that the pulse risetime is limited to 10 nH/5 mΩ or 2 μs. Unfortunately, risetimes faster than 2 μs are sometimes desirable.

The simple approach disclosed in U.S. Pat. No. 5,068,862 issued Nov. 26, 1991 to Zimmermann et al. purports to achieve fast switching by supplementing a battery of capacitors with a smaller capacitor connected in parallel. While this technique may achieve some improvement, the amount of the improvement is limited by the many inductances in the circuit that are unaffected by the presence of the small capacitor, such as the switch inductance, the load inductance, and the stray inductances.

Various approaches have been developed in attempting to overcome the inadequacies of the basic pulsed laser diode driver circuit.

In the approach disclosed in U.S. Pat. No. 5,089,727 issued Feb. 18, 1992 to Molitor et al., a fast-acting switch purportedly is realized from a combination of two critical components, a silicon controlled rectifier and a MOSFET, to obtain at the load a pulse of electrical energy having the desired rapid risetime.

In the approach disclosed in U.S. Pat. No. 5,406,572 issued Apr. 11, 1995 to Chung, U.S. Pat. No. 5,418,807 issued May 23, 1995 to Chung, and U.S. Pat. No. 5,444,729 issued May 23, 1995 to Chung, an optically activated three terminal semiconductor switch is used first to initiate current flow from an energy storage capacitor to a high power laser array with a first switch, then to short circuit the high power laser array to terminate the energy flow with a second switch. The energy storage capacitor is either a uniform stripline structure or a non-uniform stripline structure with a very low impedance.

Alternative approaches such as disclosed in United States Patent Application Publication No. 2003/0016711 published Jan. 23, 2003, and United States Patent Application Publication No. 2003/0039280 published Feb. 27, 2003, use inductors and additional switches to improve current pulse risetime.

Unfortunately, these approaches for overcoming the inadequacies of the simple RC-type driver as well as the alternative approaches cause the pulsed laser diode driver to take up more space and/or to be more complex and expensive.

BRIEF SUMMARY OF THE INVENTION

The present invention has a number of advantages over the related art, including in at least some of its embodiments achieving fast pulse risetime and a desired flat top current magnitude where the risetime is much less than the L/R time constant of the circuit and less than the closing time of the switch. Driver circuits according to at least some embodiments of the present invention achieve control of the pulse generation process with just one switch, with a load current risetime improvement relative to the transition speed of the switch. In at least some embodiments, the turn-on resistance of the switch can be relatively high relative to the load resistance so that behavior more like a real current source is achieved. In at least some embodiments, further turn-on improvements are achieved by cascading a plurality of circuit stages.

One embodiment of the present invention is a pulsed laser diode driver comprising a slow voltage discharge stage comprising a first energy storage element having a first energy storage capacity at a first voltage magnitude; a fast voltage discharge stage comprising a second energy storage element having a second energy storage capacity at a second voltage magnitude, the second energy storage capacity being less than the first energy storage capacity, and the second voltage magnitude being greater than the first voltage magnitude; a switch-controlled circuit path; and a laser diode controllably coupled to the first energy storage element and to the second energy storage element through the switch-controlled circuit path.

Another embodiment of the present invention is a method for driving a laser diode with a current pulse. A first voltage magnitude is established in a first energy storage element having a first energy storage capacity. A second voltage magnitude is established in a second energy storage element having a second energy storage capacity, the second energy storage capacity being smaller than the first energy storage capacity, and the second voltage magnitude being greater than the first voltage magnitude. The first energy storage element and the second energy storage element are discharged into a laser diode, the discharge of the first energy storage element essentially furnishing a flattop current pulse to the laser diode, and the discharge of the second energy storage element essentially establishing a risetime characteristic of the current pulse.

Another embodiment of the present invention is a pulsed laser diode driver comprising means for establishing a first voltage magnitude in a first energy storage element having a first energy storage capacity; means for establishing a second voltage magnitude in a second energy storage element having a second energy storage capacity, the second energy storage capacity being smaller than the first energy storage capacity, and the second voltage magnitude being greater than the first voltage magnitude; and means for discharging the first energy storage element and the second energy storage element into a laser diode, the discharge of the first energy storage element essentially furnishing a flattop current pulse to the laser diode, and the discharge of the second energy storage element essentially establishing a risetime characteristic of the current pulse.

DETAILED DESCRIPTION OF THE INVENTION, INCLUDING THE BEST MODE

Figure 1:
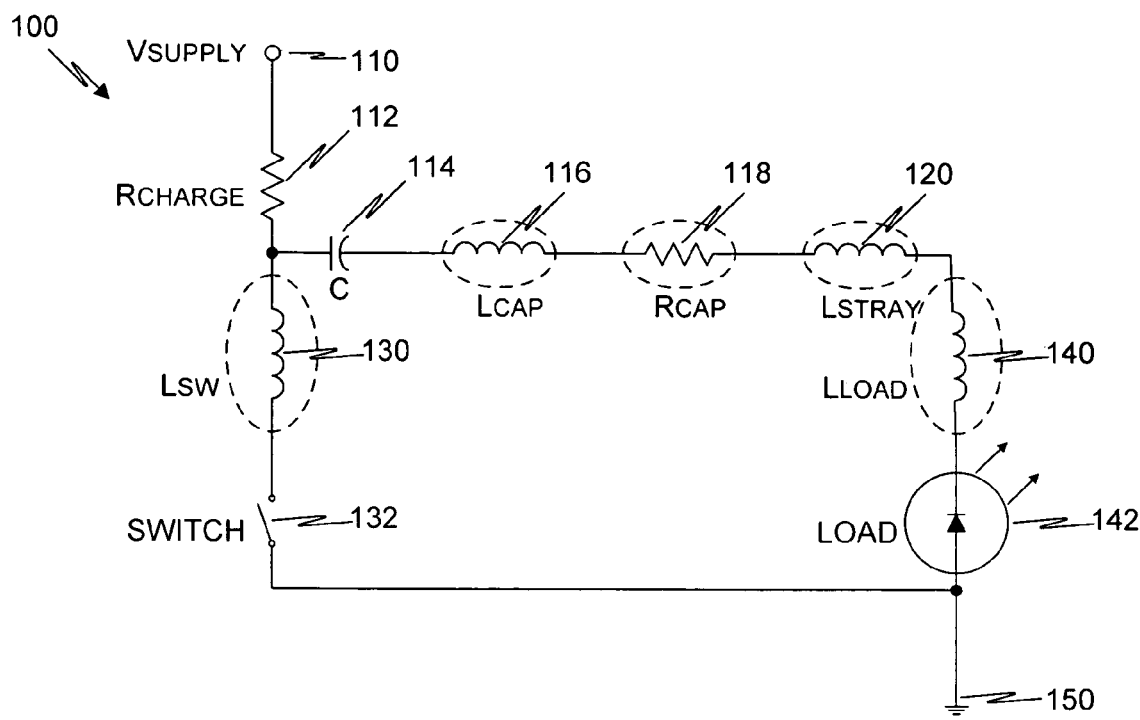
FIG. 1 is a schematic circuit diagram of a simple conventional pulsed laser diode driver.

As used herein, the term "laser diode" includes individual diode devices, arrays of diode devices, arrays and/or individual devices connected in parallel, and arrays and/or individual devices connected in series. Laser diodes have an extremely low on-resistance; for example, arrays in common use today typically have a resistance of less than 20 mΩ. When operating a laser diode in pulse mode, it is desirable that the current driver be capable of driving a pulse having a fast risetime for a given flat top current.

To achieve both a fast risetime and a desired flat top current pulse, or to be able to independently specify a risetime and pulse width (energy), a supplemental or "fast" voltage discharge stage (or multiple supplemental or "fast" voltage discharge stages) having a faster and shorter voltage discharge characteristic and a higher starting voltage relative to the main or "slow" voltage discharge stage is used in parallel with the slow voltage discharge stage. While any type of energy storage element or combination of energy storage elements may be used in the various voltage discharge stages, a particularly suitable type of energy storage element for the fast voltage discharge stage is a charge storage element such as a capacitor having a small capacitance. Other types of suitable energy storage elements include batteries, fuel cells, pulse forming networks, transmission lines, and so forth. The energy storage element of the slow voltage discharge stage has sufficient energy storage at an appropriate voltage level for maintaining the desired flat top current throughout the pulse duration, while the energy storage element of the fast voltage discharge stage has less energy storage capability but a higher starting voltage for achieving the desired fast current pulse risetime. Preferably, a single closing switch is used to couple all energy storage elements to the laser diode to pulse it, although respective separate switches may be used to couple the various energy storage elements to the laser diode.

In principle, the required profile of voltage is determined by applying the desired load current profile to the complex load impedance, and a multiple stage source circuit is provided which approximates the source voltage profile. In the case of a pulsed laser diode driver, the load current profile is a flat current pulse, and the complex load impedance is an appreciable series inductance in series with an extremely low on-resistance. Consider a circuit in which the laser diode has an effective on-resistance of 5 mΩ and a series inductance of 10 nH. One way to supply a 1 kA flat pulse with a 10 ns risetime is to use a 1 kV source for 10 ns, and a 5 v source for the remainder of the pulse. In other words, the fast voltage discharge stage is in effect causing the circuit to "think" that it is going to generate a very high current pulse, but the energy in the energy storage device of the fast stage dies out without contributing too much to the flat top current. Consider, for example, a pulsed laser diode driver that has a fast voltage discharge stage with a 1 kV supply. The driver circuit "thinks" it is going to produce 200 kA with a risetime determined by the L/R time constant, which is 2 μs where the circuit inductance is 10 nH. However, since the energy in the capacitor is prematurely exhausted, 200 kA of current is not produced. However, 1 kA of current is produced in the first 10 ns, thereby in effect realizing a fast risetime of 10 ns that is less than the L/R time.

Figure 2:
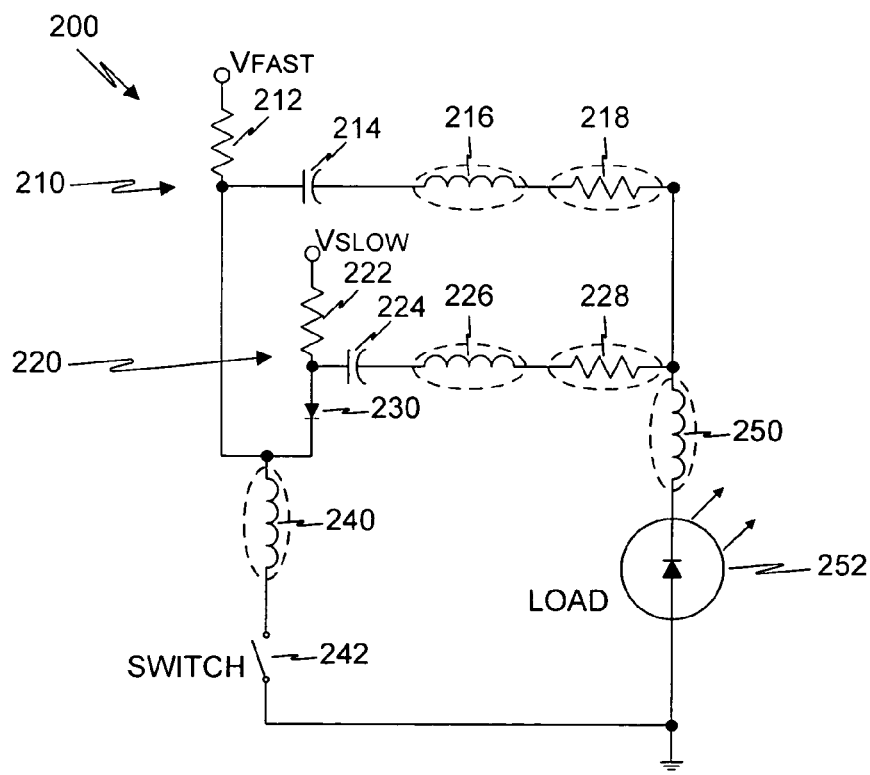
FIG. 2 is a schematic circuit diagram of an embodiment of an improved pulsed laser diode driver in accordance with the present invention.

FIG. 2 is a schematic circuit diagram of an embodiment of an improved pulsed laser driver circuit 200. The pulsed laser driver circuit 200 has two capacitor stages as the voltage discharge stages, a fast stage 210 operated from voltage $V_{FAST}$ applied through charging resistor 212 and a slow stage 220 operated from voltage $V_{SLOW}$ applied through charging resistor 222. The voltage $V_{FAST}$ is a high voltage relative to the voltage $V_{SLOW}$. While the fast and slow capacitors in the pulsed laser driver circuit 200 are shown as being charged through respective power supplies and charging resistors, any desired charge source may be used. While a series combination of a charging resistor and voltage source is shown in FIG. 2 for clarity, it may not be the most efficient type of charge source. Other types of charge sources such as a resonant charge source, a current source, and so forth may be used if desired. The slow capacitor stage includes a capacitor 224 having a relatively high capacitance selected to maintain the desired current during the pulse. While the capacitor 224 may be of any desired type such as a bank of smaller valued capacitors in parallel, generally the capacitor 224 will have a parasitic inductance 226 and a parasitic resistance 228. The fast capacitor stage includes a capacitor 214 having a relatively small capacitance, along with a parasitic inductance 216 and a parasitic resistance 218. The value of the capacitor 214 is selected to achieve the desired fast current pulse risetime. A damping resistor (not shown) is also recommended to reduce ringing and shape the pulse. Preferably a single closing switch 242 shunts both voltage sources in the fast capacitor stage 210 and in the slow capacitor stage 220, viz. the voltage $V_{FAST}$ and the charging resistor 212, and the voltage $V_{SLOW}$ and the charging resistor 222, to pulse the laser diode load 252 from both the fast capacitor 214 and the slow capacitor 224. The switch 242 has a parasitic inductance 240, and may be implemented with any suitable type of switch, including bipolar devices such as transistors, thyristors, IGBTs, and light-activated switches, and unipolar devices such as field effect transistors, fabricated in any suitable technology such as silicon, gallium arsenide, silicon carbide, silicon germanium, and so forth. Moreover, a switch may be implemented in an array of devices connected in series and/or in parallel, as desired. A suitable isolating device such as diode 230 may be placed in the circuit 200, illustratively in the slow capacitor stage 220, to isolate the low voltage $V_{SLOW}$ from the high voltage $V_{FAST}$.

Figure 3:
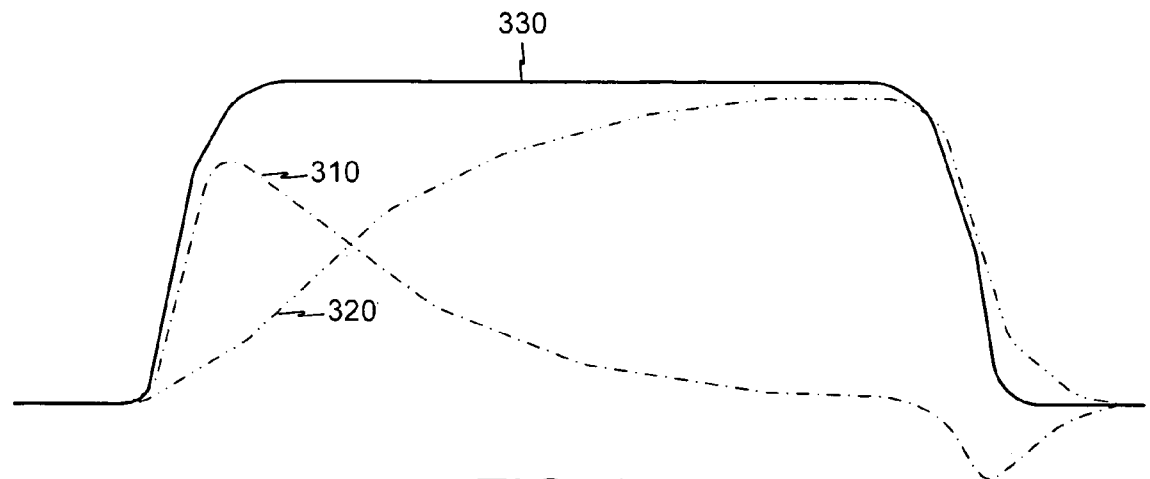
FIG. 3 is a graph showing a total load current waveform and its component fast and slow current waveforms of a pulsed laser diode driver in accordance with the present invention.

FIG. 3 is a graph showing a total load current waveform 330 and its component fast current waveform 310 and slow current waveform 320, for the pulsed laser diode driver 200. The fast capacitor 214, which operates at the high voltage $V_{FAST}$ relative to the low voltage $V_{SLOW}$, supplies a short pulse of voltage to quickly energize the load with the current 310. The slow capacitor 224 begins to contribute current 320 into the load at or near the same time, in such a way that the fast capacitor 214 provides enough current 310 to drive the rising edge of the total current 330 while the current 320 from the slow capacitor is rising to its maximum value. The slow capacitor 224 provides the energy for the longer duration of the discharge and thus can maintain a flat top current pulse. To terminate the current pulse, the switch 242 opens. Thus the total current 330 in the load 252, which is the sum of the fast capacitor current 310 plus the slow capacitor current 320, has a risetime that is much faster than could be obtained with a single capacitor designed to provide the required pulse width or energy.

Pulse forming networks, or PFN's, may be used in place of one or more of the slow and fast capacitors in the pulsed laser diode driver. As is well known in the art, a PFN is an arrangement of capacitors and inductors that is designed to deliver various current pulse shapes to a load, the most common being flat top. The PFN could also be a transmission line. Alternatively, devices such as batteries and fuel cells may be used. In a fuel cell or battery embodiment (not shown), for example, a fuel cell or battery may be used in the slow voltage discharge stage, and voltage from the fuel cell or battery may be applied through a DC to DC voltage multiplier to charge a capacitor in one or more fast discharge stages, to create a fully self-contained pulsed laser diode driver.

Figure 4:
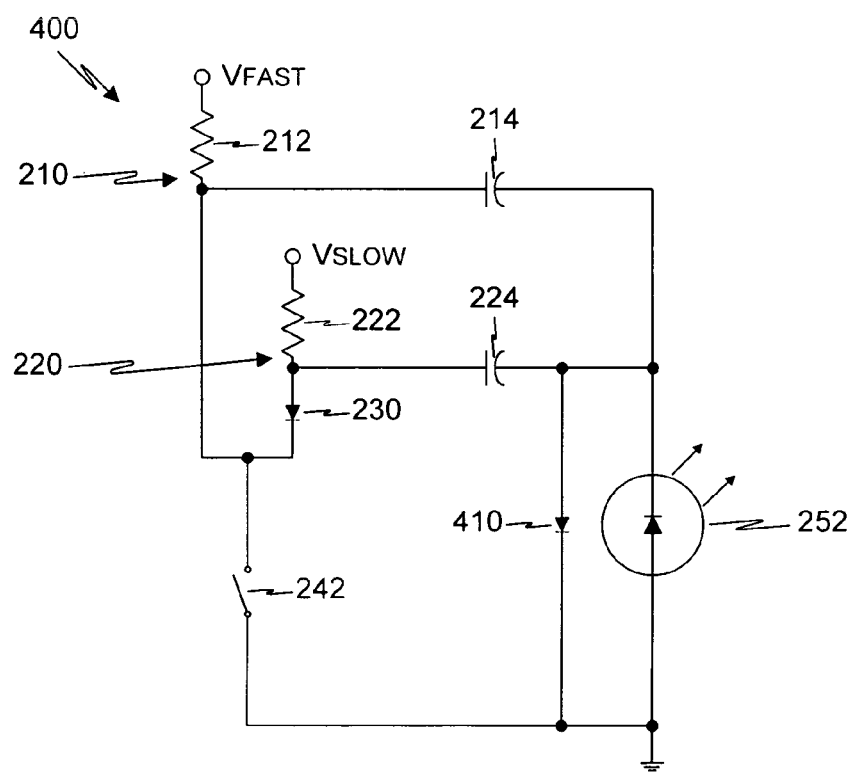
FIG. 4 is a schematic circuit diagram of a further embodiment of an improved pulsed laser diode driver in accordance with the present invention.

The circuit 200 of FIG. 2 is preferred insofar as the switch 242 may be driven from ground, and only a single switch is required. However, the charging current for the capacitors 214 and 224 flows through the load 252. If this is undesirable, then a charging diode 410 may be connected from the low side of the capacitors 214 and 224 to ground, as shown in the circuit 400 of FIG. 4. Such charging diodes are commonly used in many laser diode drivers as an anti-parallel protection diode across the laser diode, to limit reverse voltages across the laser diode which can cause damage.

Figure 5:
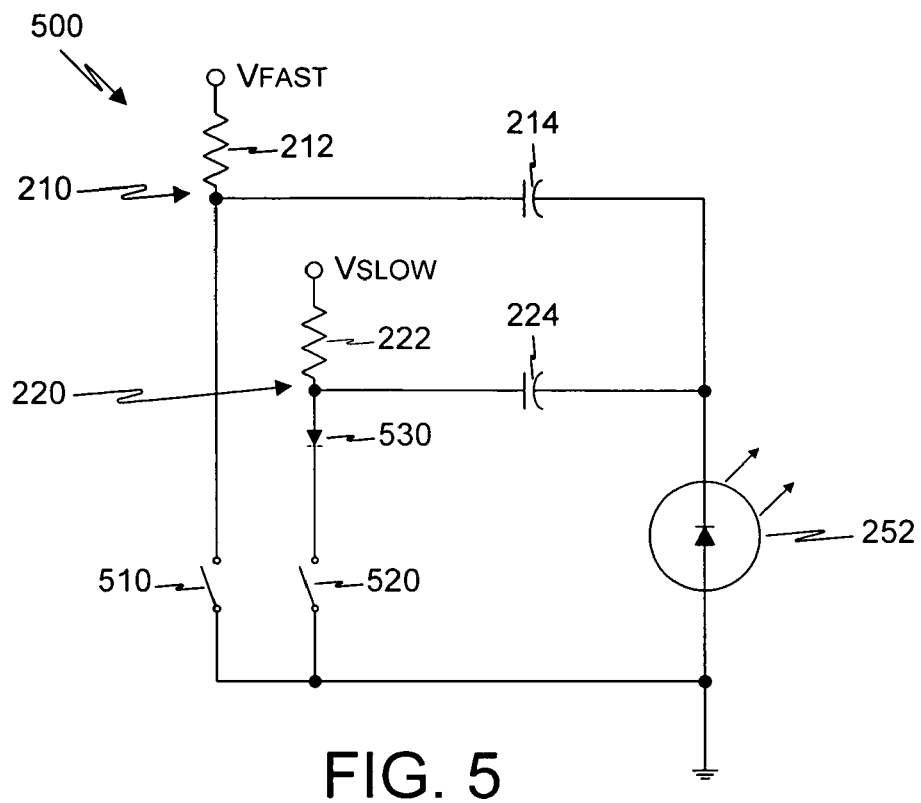
FIG. 5 is a schematic circuit diagram of a further embodiment of an improved pulsed laser diode driver in accordance with the present invention.

FIG. 5 is a schematic circuit diagram of an embodiment of an improved pulsed laser driver circuit 500 that uses separate switches for the slow and fast capacitor stages. Two separate switches 510 and 520 are used in circuit 500, the switch 510 being for the fast capacitor 214, and the switch 520 being for the slow capacitor 224. A diode 530 is used to protect the slow switch 520 from the transient voltage that arises when the fast switch 510 closes.

Advantageously, the fast switch 510 may be optimized to operate at the higher fast voltage, while the slow switch 520 may be optimized to operate at the lower slow voltage. Consider, for example, using MOSFETs for the fast switch 510 as well as the slow switch 520. One of the characteristics of a MOSFET is that its on-resistance ($R_{DS-ON}$) increases rapidly with operating voltage. If only one switch is used, as the switch 242 in the circuit 200 of FIG. 2, then it will have to operate at the higher fast capacitor voltage $V_{FAST}$ for a time, resulting in a higher $R_{DS-ON}$ than if it only needed to operate at the lower slow capacitor voltage $V_{SLOW}$. However, where separate MOSFET switches are used, such as for the switches 510 and 520, the MOSFET switch for the fast capacitor stage and the MOSFET switch for the slow capacitor stage may be optimized only for the voltage it is required to switch. Moreover, separately switching the fast and slow capacitor stages 210 and 220 allows for a more efficient switch such as a thyristor to be used for the fast capacitor stage 220, since the charge stored in the fast capacitor 214 is completely drained well before the pulse needs to be turned off. This is not the case with the slow capacitor stage 220, where the switch 520 is opened to maintain the flat top current pulse.

Figure 6:
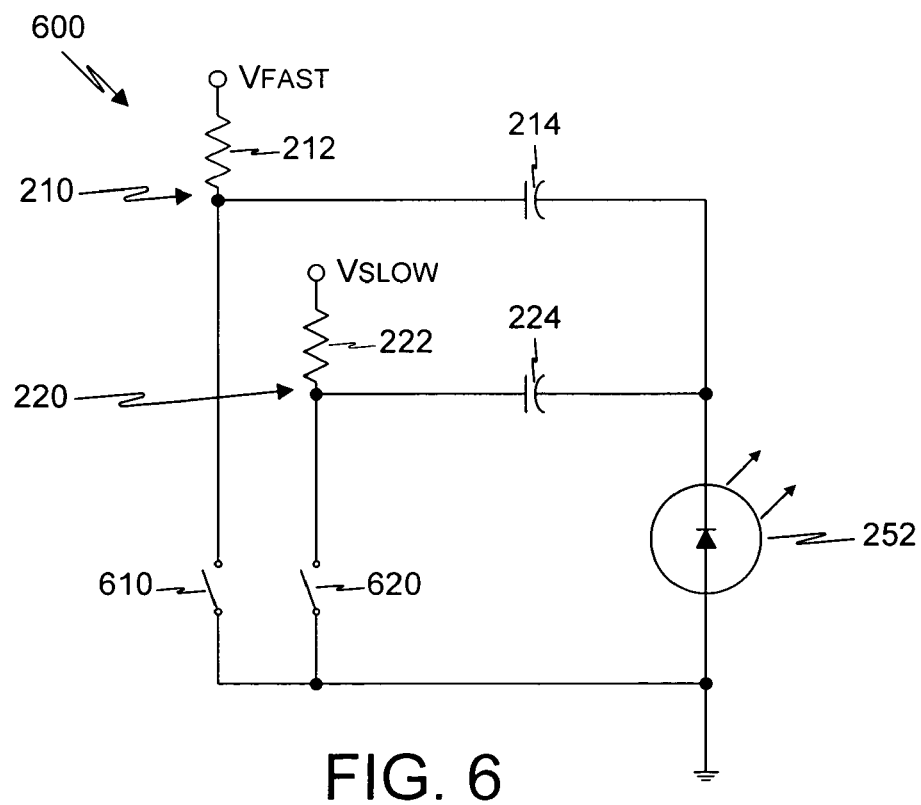
FIG. 6 is a schematic circuit diagram of a further embodiment of an improved pulsed laser diode driver in accordance with the present invention.

FIG. 6 is a schematic circuit diagram of an embodiment of a pulsed laser driver circuit 600 that is similar to the circuit 500 of FIG. 5 except that diode 530 is omitted. The slow switch 620 is designed to handle the transient voltage arising when the fast switch 610 closes, so that the diode 530 is not needed to protect the slow switch 620.

In the circuits 200, 400, 500 and 600, all of the switches have one side at ground potential, which is advantageous for triggering. However, if a trigger suitable for a floating switch is used, one or more floating closing switches may be used to connect both the fast and slow capacitors of the capacitor stages to the laser diode to pulse the laser diode. Alternatively, a grounded switch may be used to connect the laser diode to the capacitor of one of the stages, while a floating switch may be used to connect the laser diode to the capacitor of another of the stages.

Figure 7:
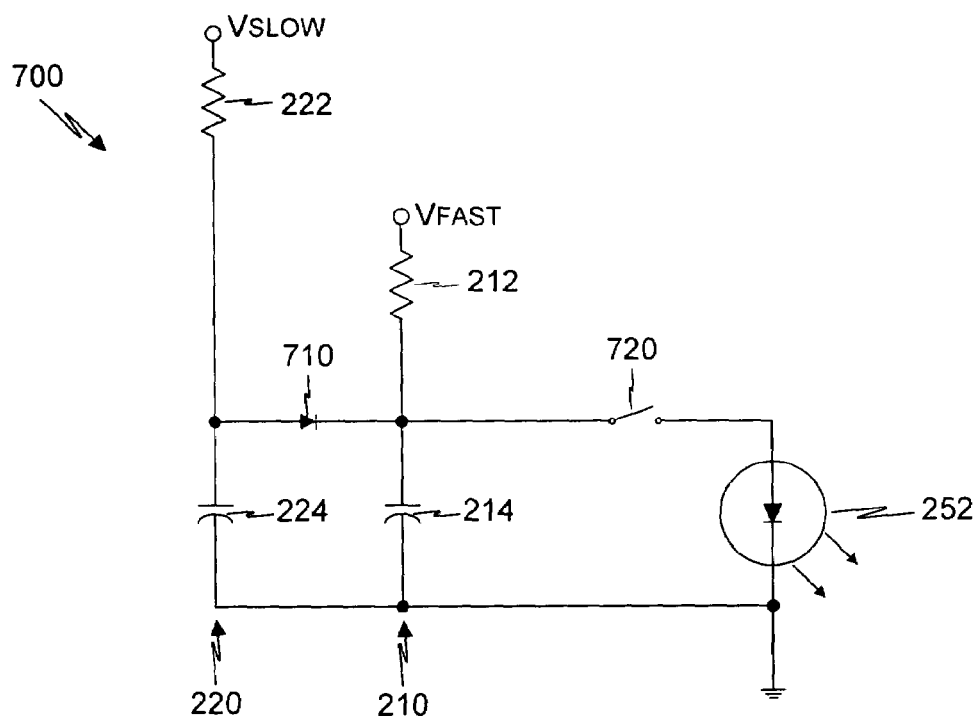
FIG. 7 is a schematic circuit diagram of a further embodiment of an improved pulsed laser diode driver in accordance with the present invention.

FIG. 7 is a schematic circuit diagram of an embodiment of an improved pulsed laser driver circuit 700 that uses a single floating closing switch to connect both the fast and slow capacitors of the capacitor stages to the laser diode to pulse the laser diode. The pulsed laser driver circuit 700 includes the fast stage 210 and the slow stage 220. The slow capacitor stage 220 includes the high-valued but slow capacitor 224, while the fast capacitor stage 210 includes the fast but low-valued capacitor 214. A single floating closing switch 720 connect both the fast capacitor 214 and the slow capacitor 224 of the capacitor stages to the laser diode to pulse the laser diode load 252. A suitable isolating device such as diode 710 is placed in the circuit 700 to isolate the low voltage $V_{SLOW}$ from the high voltage $V_{FAST}$.

Figure 8:
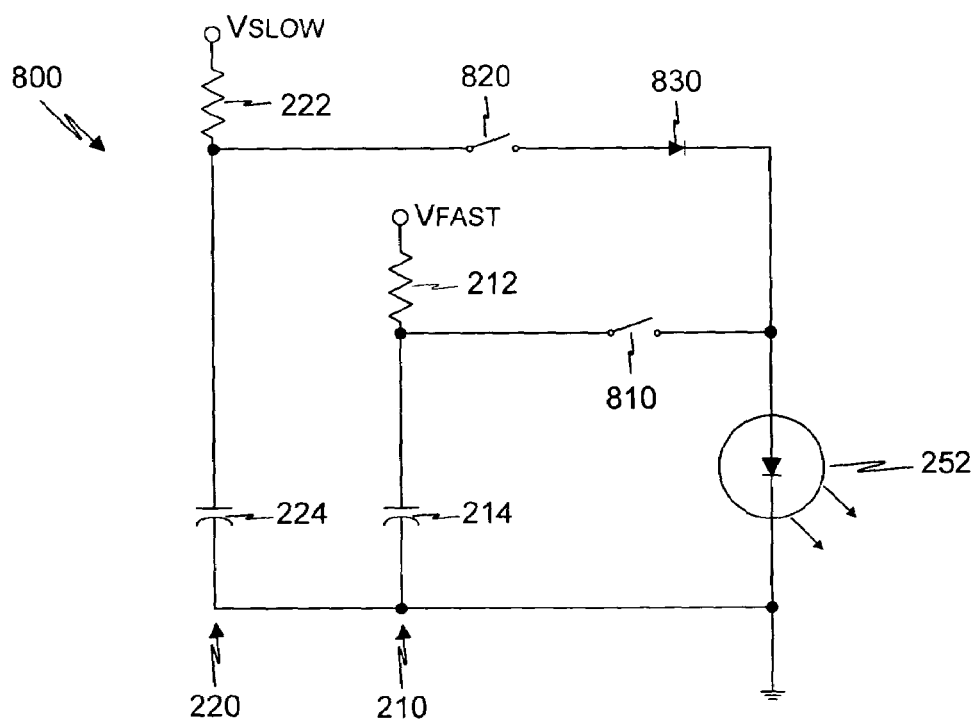
FIG. 8 is a schematic circuit diagram of a further embodiment of an improved pulsed laser diode driver in accordance with the present invention.

FIG. 8 is a schematic circuit diagram of an embodiment of an improved pulsed laser driver circuit 800 that uses separate floating closing switches to connect respectively the fast and slow capacitors of the capacitor stages to the laser diode to pulse the laser diode. The pulsed laser driver circuit 800 includes the fast stage 210 and the slow stage 220. A floating closing switch 810 connects the fast capacitor 214 of the fast capacitor stage 210 to the laser diode load 252, while a floating closing switch 820 connects the slow capacitor 224 of the slow capacitor stage 220 to the laser diode load 252. A suitable device such as a diode 830 is used to protect the slow switch 820 from the transient voltage that arises when the fast switch 810 closes.

Figure 9:
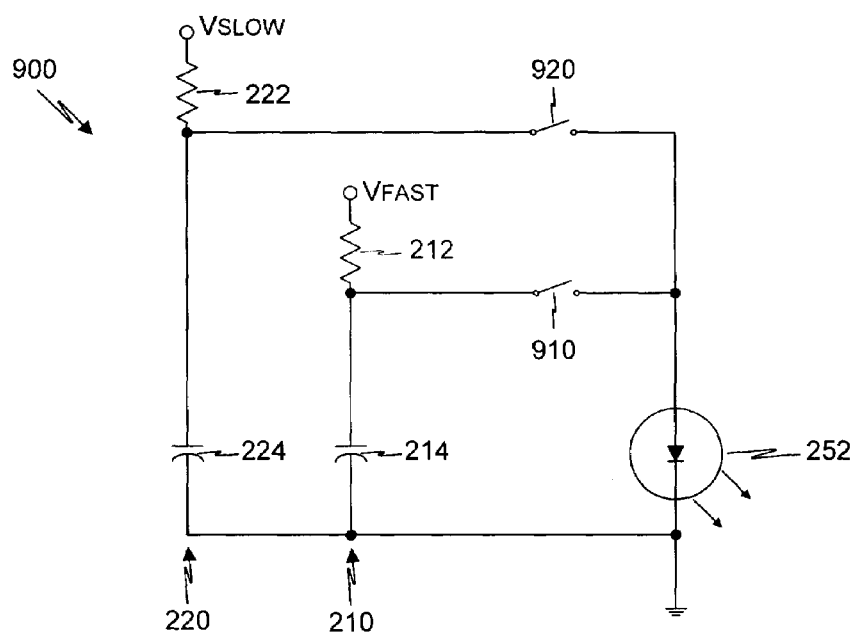
FIG. 9 is a schematic circuit diagram of a further embodiment of an improved pulsed laser diode driver in accordance with the present invention.

FIG. 9 is a schematic circuit diagram of an embodiment of a pulsed laser driver circuit 900 that is similar to the circuit 800 of FIG. 8 except that diode 830 is omitted. The slow switch 920 is designed to handle the transient voltage arising when the fast switch 910 closes, so that the diode 830 is not needed to protect the slow switch 920.

Figure 10:
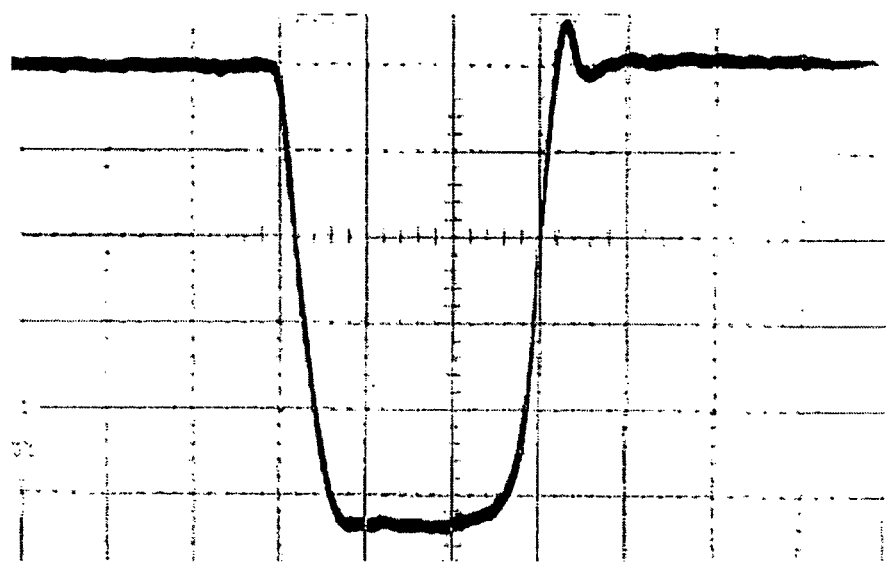
FIG. 10 is a graph showing a load current waveform in accordance with an experimental implementation of an embodiment of the present invention.

Two experimental pulsed laser diode drivers based on the embodiment of FIG. 2 were constructed and tested. In the first experimental driver, the fast voltage $V_{FAST}$ was about 430 volts, the fast charging resistor 212 was 220 Ω, the fast capacitor 214 was 1.4 nF, the slow voltage $V_{SLOW}$ was 86 volts, the slow charging resistor 222 was 220 Ω, the slow capacitor was 765 nF, the diode 230 was a SiC Schottky diode instead of a standard silicon Schottky diode, the switch 242 was a single Directed Energy Incorporated (DEI) MOSFET, and the load 252 was an array of resistors having a total resistance of 140 mΩ to represent the on-resistance of a laser diode. This driver produced the current pulse waveform shown in the graph of FIG. 10, in which each vertical division represents about 35.7 amps and each horizontal division represents 10 ns. The waveform exhibits a risetime of about 5 ns and a pulse with of about 20 ns with a peak current of 193 amps. The fast and slow voltages $V_{FAST}$ and $V_{SLOW}$ were adjusted in this experiment to achieve a flat top current pulse.

A different driver, based on the same principle was fabricated which generated a longer duration current pulse at higher current, however the risetime was slower. In the second experimental driver, the fast voltage $V_{FAST}$ was only 50 volts, the fast capacitor 214 was 50 µF, the slow voltage $V_{SLOW}$ was about 25 volts, the slow capacitor was 5.6 mF, and the diode 230 was a standard silicon Schottky diode. This driver produced the current pulse waveform shown in FIG. 11, in which each vertical division represents 880 amps while each horizontal division represents 2.0 µs. The waveform of FIG. 11 has a risetime of about 250 ns and a pulse with of about 10 µs with a peak current of 4.5 kA, despite having only 50 volts on the fast capacitor 214. The second experimental driver is a much lower impedance laser diode driver relative to the first experimental driver. A parallel array of MOSFETs was used as the switch 242, but due to the longer current risetime, a standard silicon Schottky diode was sufficient for isolating the fast and slow circuits.

Figure 12:
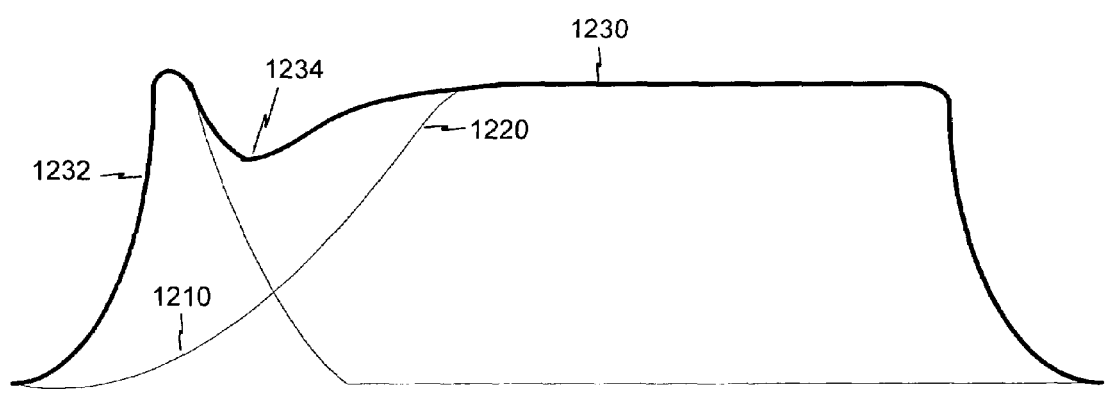
FIG. 12 is a graph showing a total load current waveform and its component fast and slow current waveforms of a pulsed laser diode driver that produces a total load current having an undesirable dip.
Figure 11:
FIG. 11 is a graph showing a load current waveform in accordance with another experimental implementation of an embodiment of the present invention.

FIG. 11 shows that the fast voltage was increased to generate the overshoot in the current waveform. The fast and slow voltages can be adjusted independently. If the fast voltage is increased more than needed to generate a flat top current pulse, a current pulse with an overshoot in the beginning is obtained. This might be advantageous for an application in which the light from a laser diode is being used to trigger a photoconductive switch, for example.

Where the load resistance is very low, a very fast risetime along with good pulse fidelity may not be achievable from a single supplemental capacitor stage. FIG. 12 is a graph showing a load current waveform 1230 having a fast risetime 1232 but also having a pronounced dip 1234. The graph of FIG. 12 might be obtained from the circuit 200 of FIG. 2 under the following circumstances. To decrease risetime, the voltage $V_{FAST}$ for the fast capacitor may be increased, but to avoid overshooting the desired flattop current, the capacitance value of the fast capacitor 214 may be decreased. However, decreasing the value of the fast capacitor 214 reduces the width of the current pulse 1210 from the fast capacitor 214. Since the risetime of the slow capacitor current 1220 is limited, the dip 1234 in the output waveform 1230 results. To reduce the dip 1234 while still realizing the desired fast risetime, multiple supplemental capacitor stages with respective fast charging voltage may be used.

Figure 13:
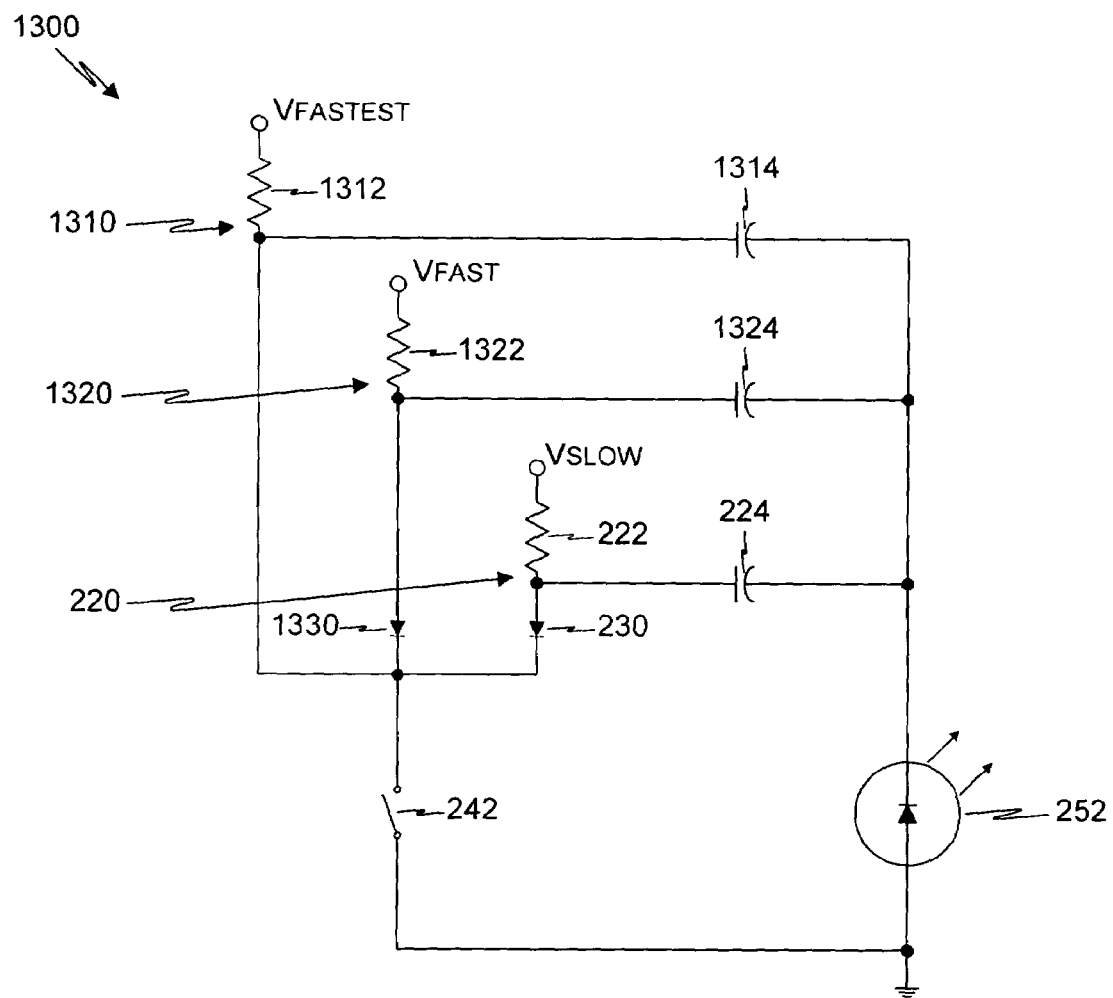
FIG. 13 is a schematic circuit diagram of a further embodiment of an improved pulsed laser diode driver for reducing the dip while achieving a faster risetime than shown in the FIG. 12 waveform, in accordance with the present invention.

FIG. 13 is a schematic circuit diagram of an embodiment of a pulsed laser driver circuit 1300 that is similar to the circuit 200 of FIG. 2 except that two fast capacitor stages 1310 and 1320 are used to supplement the slow capacitor stage 220. The fastest capacitor stage 1310 includes charging resistor 1312 and fast capacitor 1314. The fast capacitor stage 1320 includes charging resistor 1322, fast capacitor 1324, and diode 1330. To achieve a very fast risetime without excessive overshoot, a very high voltage $V_{FASTEST}$ is used in the fastest capacitor stage 1310 and the value of the fast capacitor 1314 is very small. To prevent an excessive dip from forming in the pulsed current to the load 252, a high voltage $V_{FAST}$ less than $V_{FASTEST}$ is used in the fast capacitor stage 1320 and the value of the fast capacitor 1324 is selected to be small but greater than the value of the fast capacitor 1314.

Three SPICE simulation experiments were run to demonstrate the effectiveness of multiple fast capacitor stages, for: one slow capacitor (conventional approach); one slow and one fast capacitor; and one slow and two fast capacitors. For all three experiments, the pulse trigger for the switch was simulated with an initial value of 0, a pulsed value of 1, a delay of 1.8 ns, a risetime of 3 ns, a fall time of 4 ns, and a pulse width of 15 ns. The switch was simulated with an on-resistance of 100 m$\Omega$ for a pulse value of 1, and an off-resistance of 1 G$\Omega$ for a pulse value of 0.

Figure 14:
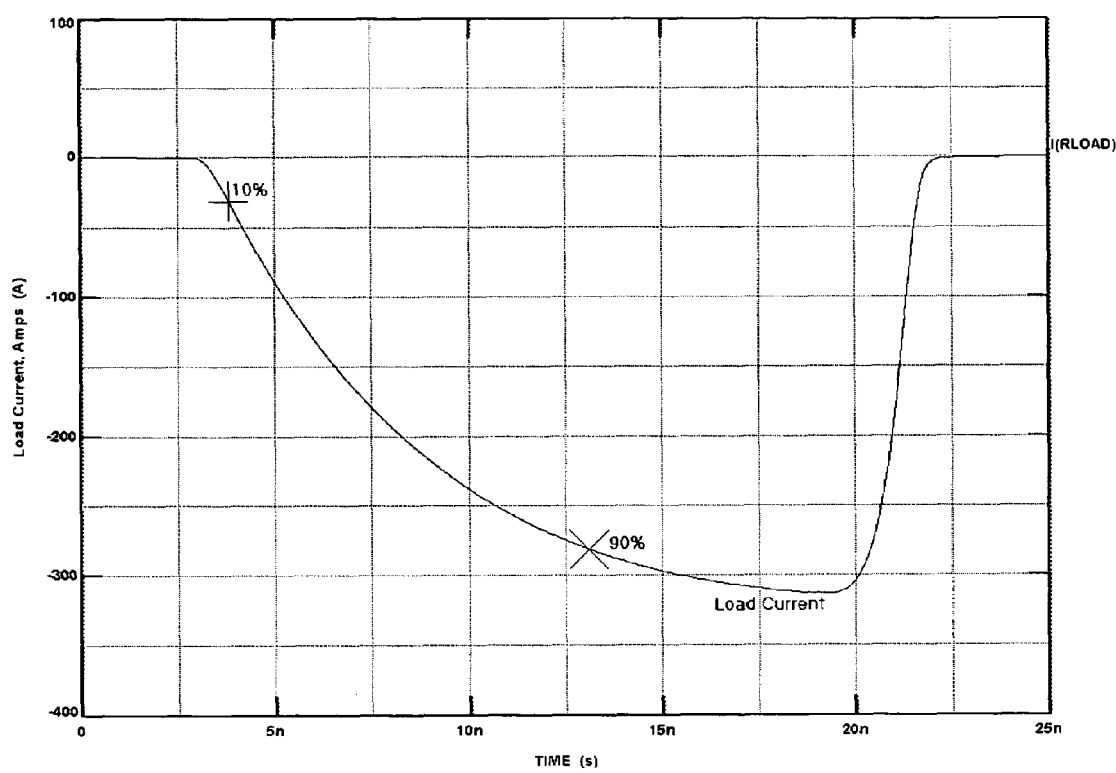
FIG. 14 is a graph showing a load current waveform in accordance with an computer simulation (SPICE) of a pulsed laser diode driver having only a slow capacitor stage.

For the first SPICE simulation, which was the case of one slow capacitor, the slow voltage was 44 volts, the value of the slow capacitor was 750 nF, the parasitic resistance of the slow capacitor was 20 m$\Omega$, the parasitic inductance of the slow capacitor was 500 pH, the load resistance was 1 m$\Omega$, and the parasitic inductance of the load was 250 pH. As shown in the graph of FIG. 14, the modeled current pulse waveform at the load has a risetime of 9.3 ns (measured at the 10% and 90% levels). This risetime is poor.

Figure 15:
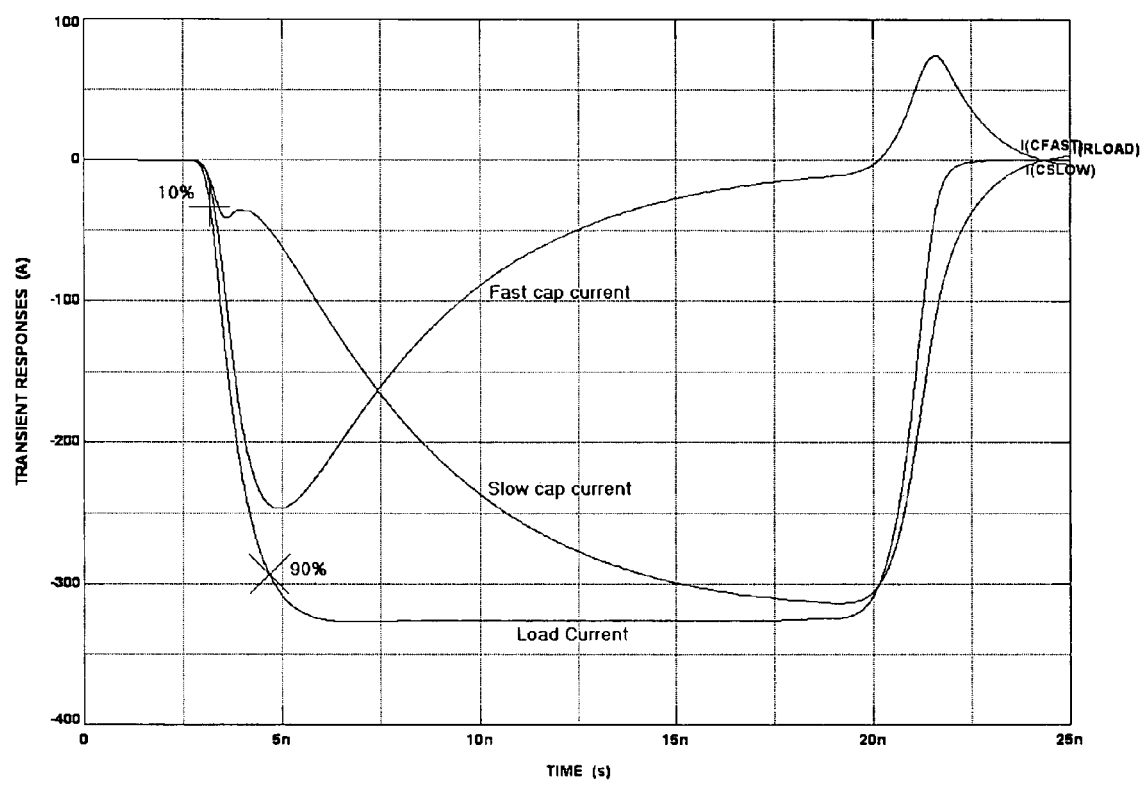
FIG. 15 is a graph showing a load current waveform in accordance with an computer simulation (SPICE) of a pulsed laser diode driver having a slow capacitor stage and a fast capacitor stage, in accordance with the present invention.

The second SPICE simulation was the case of one slow capacitor and one fast capacitor. For the slow capacitor stage, the slow voltage was 67 volts, the value of the slow capacitor was 765 nF, the parasitic resistance of the slow capacitor was 20 m$\Omega$, and the parasitic inductance of the slow capacitor was 500 pH. A diode in the slow capacitor stage was modeled as a silicon carbide Shottky diode. For the fast capacitor stage, the fast voltage was 350 volts, the value of the fast capacitor was 4.8 nF, the parasitic resistance of the fast capacitor was 3.5 m$\Omega$, and the parasitic inductance of the fast capacitor was 500 pH. A damping resistor was used in the fast capacitor stage, and had a value of 1 ohm. The use of a damping resistor is optional depending on how clean of a waveform is desired. The capacitance values were adjusted to maintain 325 amps of current into the load. The load resistance was 1 m$\Omega$, and the parasitic inductance of the load was 250 pH. As shown in the graph of FIG. 15, the current risetime decreased to 1.5 ns.

Figure 16:
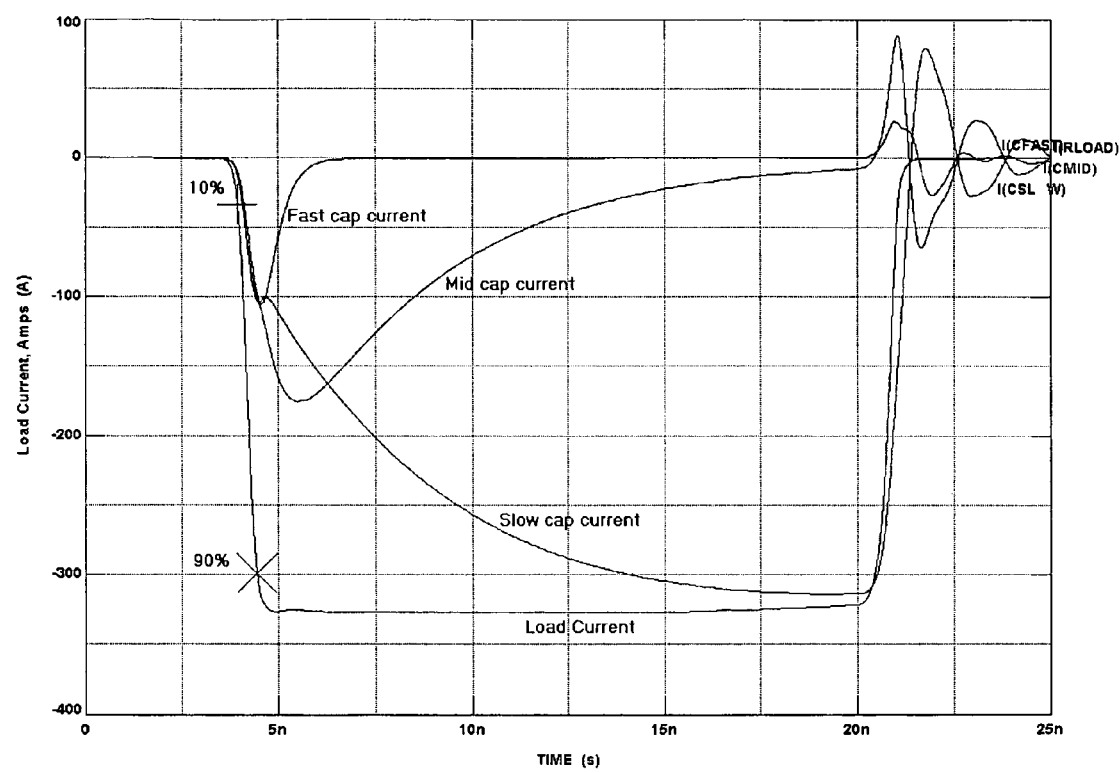
FIG. 16 is a graph showing a load current waveform in accordance with an computer simulation (SPICE) of a pulsed laser diode driver having a slow capacitor stage and two fast capacitor stages, in accordance with the present invention.

The third SPICE simulation was the case of one slow capacitor and two fast capacitors. For the slow capacitor stage, the slow voltage was 67 volts, the value of the slow capacitor was 750 nF, the parasitic resistance of the slow capacitor was 20m$\Omega$, the parasitic inductance of the slow capacitor was 500 pH, and the slow diode was modeled as a silicon carbide Shottky diode. For the fast capacitor stage, the fast voltage was 265 volts, the value of the fast capacitor was 4.5 nF, the parasitic resistance of the fast capacitor was 3.5 m$\Omega$, the parasitic inductance of the fast capacitor was 500 pH, and the fast diode was modeled as a silicon carbide Shottky diode. A damping resistor was used in the fast capacitor stage, and had a value of 1 ohm. For the fastest capacitor stage, the fastest stage voltage was 1000 volts, the value of the fastest stage capacitor was 100 pF, the parasitic resistance of the fast capacitor was 2 m$\Omega$, and the parasitic inductance of the fast capacitor was 500 pH. A damping resistor was used in the fastest capacitor stage, and had a value of 5 ohms. The capacitance values were adjusted to maintain 325 amps of current into the load. The load resistance was 1 m$\Omega$, and the parasitic inductance of the load was 250 pH. As shown in the graph of FIG. 16, the risetime decreased to 0.5 ns.

As demonstrated by the SPICE simulations, the technique of multiple capacitor stages is advantageous for reducing the current risetime while maintaining a flat-top current pulse. Moreover, the technique of multiple capacitor stages may be used to generate current waveforms of various shapes by either adjusting the voltages on each stage, or by changing the values of the capacitors.

For any embodiment, minimizing the circuit inductance is desirable. One method to minimize circuit inductance is to mount all the components on a very thin FR4 board or a flexible substrate ("flex circuit"). Another method is to use hybrid mounting techniques where certain components (integrated circuits, transistors, diodes, etc.) are mounted to the flex circuit in die form, i.e., without any packaging. Connection to these components can be made using standard hybrid connection techniques including wire bonds, ribbon bonds and flip-chip in order to reduce the inductance of the circuit board-to-die connection.

The flex circuit may be mounted to a stiffener (conducting or insulating), such as a conventional circuit board material, e.g. FR4, and may also serve as a higher impedance circuit board for circuits where reduced inductance is not as important (e.g., DC supplies, trigger lines. etc.). If the stiffener is a thermal conductor, it can also be used to conduct heat away from the components mounted on the flexible circuit to some cooling mechanism.

Modules based on this circuit configuration can be arranged in parallel to achieve higher currents than possible with a single (switching) device. Usually the power limitation in a circuit is the action, power, current, or voltage of the switch.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, some multiple switch embodiments use only grounded switches while other multiple switch embodiments use only floating switches, but floating and grounded switches may both be used within the same embodiment. These and other variations and modifications of the embodiments disclosed herein may be made without departing from the scope and spirit of the invention.

The invention claimed is:

1. A pulsed laser diode driver comprising:
    a slow voltage discharge stage comprising a first capacitive energy storage element having a first energy storage capacity and being operatively charged to a first voltage magnitude;
    a fast voltage discharge stage comprising a second capacitive energy storage element having a second energy storage capacity less than the first energy storage capacity, and being operatively charged to a second voltage magnitude greater than the first voltage magnitude;
    a switch-controlled circuit path; and
    a laser diode controllably coupled through the switch-controlled circuit path to the first capacitive energy storage element for operatively receiving a discharge of energy therefrom, and to the second capacitive energy storage element for operatively receiving a discharge of energy therefrom.

2. The pulsed laser diode driver of claim 1 further comprising a first charge source for establishing the first magnitude voltage, and a second charge source for establishing the second magnitude voltage, wherein:
    the first capacitive energy storage element is a first capacitor coupled to the first charge source;
    the second capacitive energy storage element is a second capacitor coupled to the second charge source;

the switch-controlled circuit path comprises a switch having a first terminal coupled to a first terminal of the laser diode, and a second terminal coupled to a first terminal of the first capacitor and to a first terminal of the second capacitor; and a second terminal of the laser diode is coupled to a second terminal of the first capacitor and to a second terminal of the second capacitor.

3. The pulsed laser diode driver of claim 2 wherein the first terminal of the switch is grounded.

4. The pulsed laser diode driver of claim 2 wherein:
the first terminal of the switch is not grounded; and
the second terminal of the switch is not grounded.

5. The pulsed laser diode driver of claim 1 further comprising a first charge source for establishing the first magnitude voltage, and a second charge source for establishing the second magnitude voltage, wherein:

the first capacitive energy storage element is a first capacitor coupled to the first charge source;

the second capacitive energy storage element is a second capacitor coupled to the second charge source;

the switch-controlled circuit path comprises a first switch and a second switch, the first switch having a first terminal coupled to a first terminal of the laser diode and a second terminal coupled to a first terminal of the first capacitor, and the second switch having a first terminal coupled to the first terminal of the laser diode and a second terminal coupled to a first terminal of the second capacitor; and a second terminal of the laser diode is coupled to a second terminal of the first capacitor and to a second terminal of the second capacitor.

6. The pulsed laser diode driver of claim 5 wherein:
the first terminal of the first switch is grounded; and
the first terminal of the second switch is grounded.

7. The pulsed laser diode driver of claim 5 wherein:
the first terminal of the first switch is not grounded;
the second terminal of the first switch is not grounded;
the first terminal of the second switch is not grounded; and
the second terminal of the second switch is not grounded.

8. The pulsed laser diode driver of claim 1 wherein the switch-controlled circuit path comprises a first switch having a floating terminal and a second switch having a grounded terminal, the floating terminal of the first switch being coupled to a first terminal of the laser diode, and the grounded terminal of the second switch being coupled to a second terminal of the laser diode.

9. The pulsed laser diode driver of claim 1 wherein the switch-controlled circuit path comprises at least one switch that comprises a single switch device, a series circuit of individual switch devices, a parallel circuit of individual switch devices, or any combination of the foregoing.

10. The pulsed laser diode driver of claim 1 wherein the first capacitive energy storage element comprises a capacitor, a capacitor contained in a pulse forming network, a capacitor coupled to a battery, a capacitor coupled to a fuel cell, an array of one or more of the foregoing, or any combination of the foregoing.

11. The pulsed laser diode driver of claim 1 wherein the second capacitive energy storage element comprises a capacitor, a capacitor contained in a pulse forming network, a capacitor coupled to a battery, a capacitor coupled to a fuel cell, an array of one or more of the foregoing, or any combination of the foregoing.

12. The pulsed laser diode driver of claim 1 wherein the laser diode comprises a single laser diode device, an array of laser diode devices connected in series, an array of laser diode devices connected in parallel, or any series or parallel connection of the of the foregoing.

13. The pulsed laser diode driver of claim 1, further comprising:

an additional fast voltage discharge stage comprising a third capacitive energy storage element having a third capacitive energy storage capacity less than the second capacitive energy storage capacity, and being operatively charged to a third voltage magnitude greater than the second voltage magnitude;

the laser diode being controllably coupled through the switch-controlled circuit path to the third capacitive energy storage element for operatively receiving a discharge of energy therefrom, as well as to the first capacitive energy storage element and to the second capacitive energy storage element.

14. The pulsed laser diode driver of claim 1 wherein the switch-controlled circuit path comprises a closing switch.

15. The pulsed laser diode driver of claim 1 wherein the switch-controlled circuit path comprises a closing switch for controllably discharging energy to the laser diode from the first capacitive energy storage element and from the second capacitive energy storage element.

16. The pulsed laser diode driver of claim 1 wherein the switch-controlled circuit path comprises:

a first closing switch for controllably discharging energy from the first capacitive energy storage element to the laser diode; and a second closing switch different than the first closing switch for controllably discharging energy from the second capacitive energy storage element to the laser diode.

17. A method for driving a laser diode with a current pulse, comprising:

establishing a first voltage magnitude in a first energy storage element having a first energy storage capacity;

establishing a second voltage magnitude in a second energy storage element having a second energy storage capacity, the second energy storage capacity being smaller than the first energy storage capacity, and the second voltage magnitude being greater than the first voltage magnitude;

discharging the first energy storage element and the second energy storage element into a laser diode, the discharge of the first energy storage element essentially furnishing a flattop current pulse to the laser diode, and the discharge of the second energy storage element essentially establishing a risetime characteristic of the current pulse;

establishing a third voltage magnitude in a third energy storage element having a third energy storage capacity, the third energy storage capacity being smaller than the second energy storage capacity, and the third voltage magnitude being greater than the second voltage magnitude; and discharging the third energy storage element into the laser diode, the discharge of the third energy storage element essentially establishing the risetime characteristic of the current pulse along with the discharge of the second energy storage element.

18. A pulsed laser diode driver comprising:

means for establishing a first voltage magnitude in a first energy storage element having a first energy storage capacity;

means for establishing a second voltage magnitude in a second energy storage element having a second energy storage capacity, the second energy storage capacity being smaller than the first energy storage capacity, and the second voltage magnitude being greater than the first voltage magnitude;

means for discharging the first energy storage element and the second energy storage element into a laser diode, the discharge of the first energy storage element essentially furnishing a flattop current pulse to the laser diode, and the discharge of the second energy storage element essentially establishing a risetime characteristic of the current pulse;

means for establishing a third voltage magnitude in a third energy storage element having a third energy storage capacity, the third energy storage capacity being smaller than the second energy storage capacity, and the third voltage magnitude being greater than the second voltage magnitude; and means for discharging the third energy storage element into the laser diode, the discharge of the third energy storage element essentially establishing the risetime characteristic of the current pulse along with the discharge of the second energy storage element.

* * * * *

UNITED STATES PATENT AND TRADEMARK OFFICE
CERTIFICATE OF CORRECTION

| | | |
|---|---|---|
| PATENT NO. | : 7,545,839 B2 | Page 1 of 1 |
| APPLICATION NO. | : 10/751301 | |
| DATED | : June 9, 2009 | |
| INVENTOR(S) | : David M. Giorgi et al. | |

It is certified that error appears in the above-identified patent and that said Letters Patent is hereby corrected as shown below:

Title page, after INID Code (73), the assignee address "Can Diego, CA (US)" should read --San Diego, CA (US)--.

Signed and Sealed this

Twenty-sixth Day of January, 2010

David J. Kappos
*Director of the United States Patent and Trademark Office*